(12) United States Patent
Suzuki et al.

(10) Patent No.: US 11,360,118 B2
(45) Date of Patent: Jun. 14, 2022

(54) CONTACT PROBE AND INSPECTING SOCKET INCLUDING THE SAME

(71) Applicant: Yamaichi Electronics Co., Ltd., Tokyo (JP)

(72) Inventors: Katsumi Suzuki, Tokyo (JP); Seiya Yamamoto, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 16/983,132

(22) Filed: Aug. 3, 2020

(65) Prior Publication Data

US 2021/0072284 A1  Mar. 11, 2021

(30) Foreign Application Priority Data

Sep. 6, 2019  (JP) .............................. JP2019-162880

(51) Int. Cl.
*G01R 1/04* (2006.01)
*G01R 1/067* (2006.01)
*G01R 1/073* (2006.01)

(52) U.S. Cl.
CPC ....... *G01R 1/0466* (2013.01); *G01R 1/06738* (2013.01); *G01R 1/07328* (2013.01)

(58) Field of Classification Search
CPC .............. G01R 1/0466; G01R 1/07328; G01R 1/06738
See application file for complete search history.

(56) References Cited

U.S. PATENT DOCUMENTS

| | | | | |
|---|---|---|---|---|
| 6,208,155 | B1 * | 3/2001 | Barabi ................. | G01R 1/0466 324/750.25 |
| 7,545,159 | B2 * | 6/2009 | Winter ............... | G01R 1/06733 324/755.05 |
| 10,847,915 | B2 * | 11/2020 | Isagoda ................ | G01R 1/0466 |
| 10,976,346 | B2 * | 4/2021 | Yamamoto ........... | G01R 1/0433 |

(Continued)

FOREIGN PATENT DOCUMENTS

| | | |
|---|---|---|
| JP | 2011-158329 A | 8/2011 |
| JP | 2013-113753 A | 6/2013 |
| JP | 6433680 B2 | 12/2018 |

(Continued)

OTHER PUBLICATIONS

Office Action dated Nov. 29, 2021 in corresponding Korean Patent Application No. 10-2020-0102701.

*Primary Examiner* — Paresh Patel
(74) *Attorney, Agent, or Firm* — Hamilton, Brook, Smith & Reynolds, P.C.

(57) ABSTRACT

The contact probe comprises a barrel 50, an inspection device side terminal 60, a test board side terminal 70, and a spring 80 disposed in a state of being in contact with the test board side terminal 70 and the inspection device side terminal 60, the test board side terminal 70 includes a stop portion 74 that can abut on the caulked portion 52 in the barrel 50 and a terminal body that projects from the other end 56 of the barrel 50, and the terminal body includes, in order from a tip end, a first shaft section 71, a second shaft section 72 having a diameter larger than a diameter of the first shaft section 71, and a third shaft section 73 having a diameter smaller than the diameter of the second shaft section 72 and having at least a part that can be housed in the barrel 50.

2 Claims, 12 Drawing Sheets

(56) References Cited

U.S. PATENT DOCUMENTS

2011/0221464 A1    9/2011   Nagata et al.

FOREIGN PATENT DOCUMENTS

| KR | 10-2011-0103338 A   | 9/2011 | |
|----|---------------------|--------|--|
| KR | 10-2016-0096968 A   | 8/2016 | |
| WO | WO-2013080675 A1 *  | 6/2013 | ......... H01R 13/2471 |
| WO | 2018216273 A1       | 11/2018 | |
| WO | 2019131438 A1       | 7/2019 | |

* cited by examiner

CONTACT PROBE AND INSPECTING SOCKET INCLUDING THE SAME

RELATED APPLICATION(S)

This application claims priority under 35 U.S.C. § 119 or 365 to Japanese Application No. 2019-162880, filed Sep. 6, 2019. The entire teachings of the above application(s) are incorporated herein by reference.

BACKGROUND

For an electronic device such as an IC package mounted on electronic equipment or the like, in general, a test to remove potential defects of the electronic device in a stage prior to mounting the device on a wiring board is performed using an inspecting socket. The inspecting socket comprises a contact probe electrically connecting an electrode part such as a solder ball or a solder bump of the electronic device to a test board or a printed wiring board (a substrate) for use as a mounting board (e.g., Japanese Publication No. JP 2013-113753).

The contact probe described in Patent Literature 1 includes a barrel, a first plunger, a second plunger and a coil spring, and includes a configuration where when the probe is not mounted in the socket and the IC package is not mounted, a lower end of the barrel in which the second plunger on a test board side is housed abuts on a through hole formed in a base member.

SUMMARY

Furthermore, as another aspect of an inspecting socket, as shown in, for example, FIG. 11 and FIG. 12, a tip end side of a plunger 600 on an IC package 300 side is inserted into a through hole 160*a* formed in a movable pedestal 160. The pedestal 160 is most away from a base member 120 when a contact probe is not mounted in the socket and the IC package is not mounted (FIG. 12), and most proximate to the base member 120 when the IC package is mounted (FIG. 11).

At this time, at least when the IC package is mounted, it is necessary to insert the tip end of the plunger 600 into the through hole 160*a* formed in the pedestal 160 to bring the IC package 300 into contact with the tip end side of the plunger 600.

However, in a configuration where a lower end 560 of a barrel 500 abuts on a through hole 140*a* formed in a base member 140, a projection amount of a tip end side of a plunger 700 on a test board 200 side increases. Conversely, a projection amount of the tip end side of the plunger 600 on the IC package 300 side increases. In this case, when the probe is not mounted in the socket and the IC package is not mounted (FIG. 12), the tip end side of the plunger 600 might fall from the through hole 160*a* formed in the pedestal 160.

When a dimension of a contact probe 400 or the like (e.g., an outer diameter of the plunger 600 or an inner diameter of the through hole 160*a*) is taken into consideration, it is difficult to insert, into the through hole 160*a*, the tip end side of the plunger 600 that is off from the through hole 160*a*. If the pedestal 160 is forced to move in a direction in which the tip end side of the plunger 600 is inserted into the through hole 160*a*, the contact probe 400 might be broken. That is, also when the probe is not mounted in the socket and the IC package is not mounted, it is preferable that the tip end side of the plunger 600 is inserted into the through hole 160*a*.

To solve the problem, an object of the present disclosure is to provide a contact probe, in which projection amounts of a tip end side of a test board side terminal and a tip end side of an inspection device side terminal can be controlled, and an inspecting socket comprising this contact probe.

Solution to the Problem

To achieve the above object, a contact probe of the present disclosure and an inspecting socket comprising this contact probe employ following means.

That is, a contact probe according to an aspect of the present disclosure is a contact probe that electrically connects a test board to an inspection device, comprising a barrel formed in a cylindrical shape having opposite ends opened, extending in an axial direction and including a caulked portion formed to reduce an inner diameter, an inspection device side terminal having a base end side fixed to a side of one end of the barrel and having a tip end in contact with the inspection device, a test board side terminal housed, on a side of the other end of the barrel, to be movable forward and backward and having a tip end in contact with the test board, and a spring disposed in the barrel in a state of being in contact with the test board side terminal and the inspection device side terminal, wherein the test board side terminal includes a stop portion that is to abut on the caulked portion in a direction from the one end side of the barrel toward the other end side in the barrel, and a terminal body that projects from the other end of the barrel, and the terminal body includes, in order from the tip end, a first shaft section that comes in contact with the test board, a second shaft section having a diameter larger than a diameter of the first shaft section and located outside the barrel, and a third shaft section having a diameter smaller than the diameter of the second shaft section and having at least a part to be housed in the barrel.

According to the contact probe of the present aspect, when the contact probe is housed in the socket in a mode where the tip end side of the test board side terminal (the first shaft section that the terminal body has) and the tip end side of the inspection device side terminal are projected from opposite surfaces of the socket, the second shaft section having the diameter larger than that of the first shaft section abuts from inside the socket, so that drop of the contact probe to the test board side can be avoided. Furthermore, by adjustment of a position of the second shaft section, projection amounts of the tip end side of the test board side terminal and the tip end side of the inspection device side terminal that project from the socket can be controlled.

Furthermore, if a shaft section itself that can be housed in the barrel is an abutment portion, a shaft section on a tip end side of the shaft section (i.e., the shaft section that comes in contact with the test board) has to be smaller in diameter than the shaft section that can be housed in the barrel. This might cause decrease in strength or decrease in conductivity of the shaft section that comes in contact with the test board. On the contrary, the partially expanded second shaft section is provided, so that the shaft section (the first shaft section) that comes in contact with the test board does not have to be reduced in diameter as compared with the shaft section (the third shaft section) that can be housed in the barrel. Consequently, the strength of the first shaft section can be achieved, and the conductivity can be increased.

Note that the contact probe according to the present aspect is a one-side sliding type contact probe including the test board side terminal to be moved to the barrel by the spring. At this time, the third shaft section that the terminal body has is the shaft section to be housed in the barrel when the inspection device is mounted.

Furthermore, the caulked portion of the barrel and the stop portion can avoid falling of the test board side terminal from the barrel.

Additionally, in the contact probe according to the aspect of the present disclosure, the caulked portion is formed at the one end of the barrel.

According to the contact probe of the present aspect, a dimension of the test board side terminal can be shorter than that in case where the caulked portion is formed between one end and the other end of the barrel.

In addition, an inspecting socket according to an aspect of the present disclosure comprises the above contact probe, a socket body housing the one end side of the barrel and including an inspection device side through hole from which the tip end side of the inspection device side terminal projects, a socket fixing part attached to the socket body, housing the other end side of the barrel and including a test board side through hole from which the first shaft section of the test board side terminal projects, and a socket movable part that is attached to be movable away from and close to the socket body in a state where the tip end side of the inspection device side terminal that projects from the socket body is inserted into a pedestal through hole, and on which the inspection device is mounted, wherein the test board side through hole has a diameter smaller than the diameter of the second shaft section.

According to the inspecting socket of the present aspect, when the tip end side of the test board side terminal (the first shaft section of the terminal body) is projected from the board side through hole formed in the socket fixing part, the second shaft section having the diameter larger than that of the first shaft section abuts on the board side through hole. Consequently, it is possible to avoid falling of the inspection device side terminal from the socket movable part when the inspection device is not mounted (when the socket body is most away from the socket movable part). Furthermore, by adjustment of a position of the second shaft section along an axial X-direction, an insertion amount of the tip end side of the inspection device side terminal to the socket movable part when the inspection device is not mounted can be determined.

Advantageous Effects of Invention

The present disclosure can provide a contact probe in which projection amounts of a tip end side of a test board side terminal and a tip end side of an inspection device side terminal can be controlled, and an inspecting socket comprising this contact probe.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Hereinafter, description will be made as to a contact probe according to an embodiment of the present disclosure and an inspecting socket including this contact probe with reference to the drawings.

First, a configuration of a socket 10 will be described.

Figure 1:
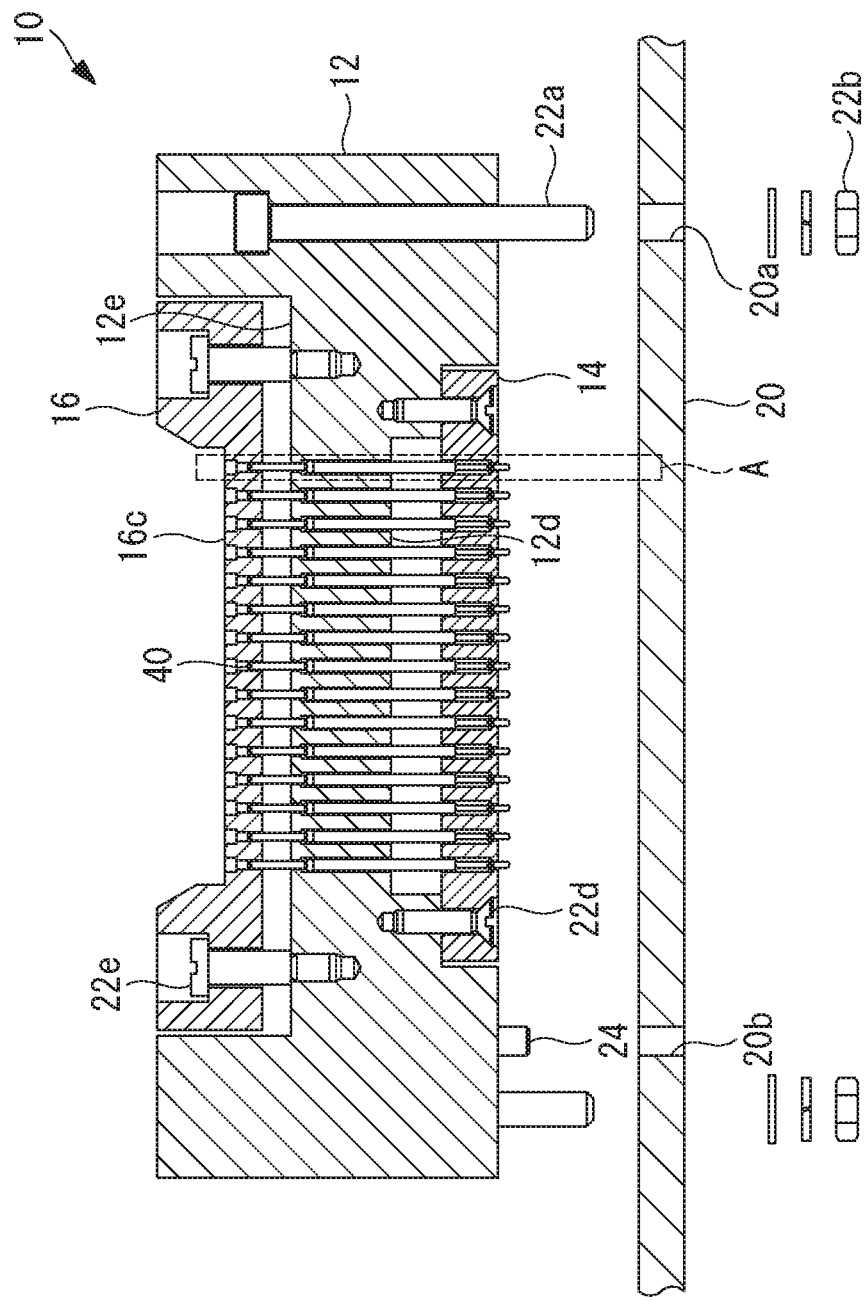
FIG. 1 is a longitudinal cross-sectional view showing a socket according to an embodiment of the present disclosure before mounted on a test board.
Figure 2:
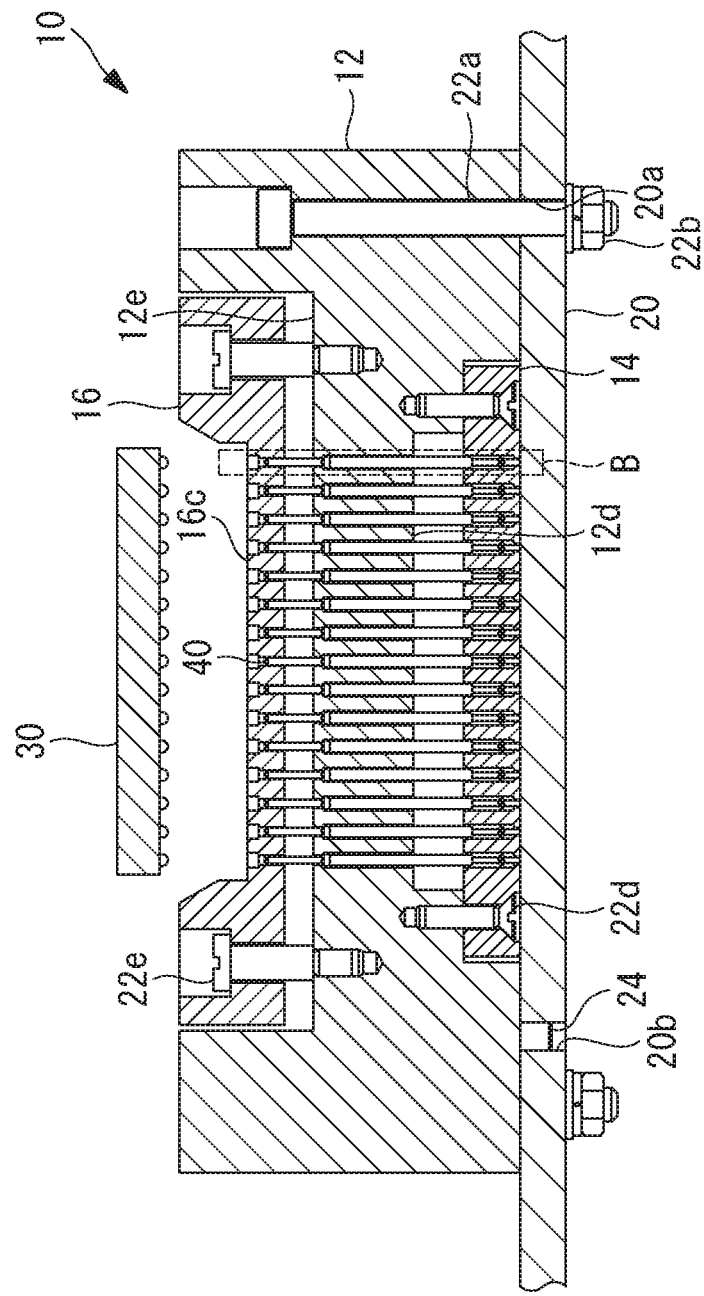
FIG. 2 is a longitudinal cross-sectional view showing the socket according to the embodiment of the present disclosure after the socket is mounted on the test board and before an IC package is mounted.
Figure 3:
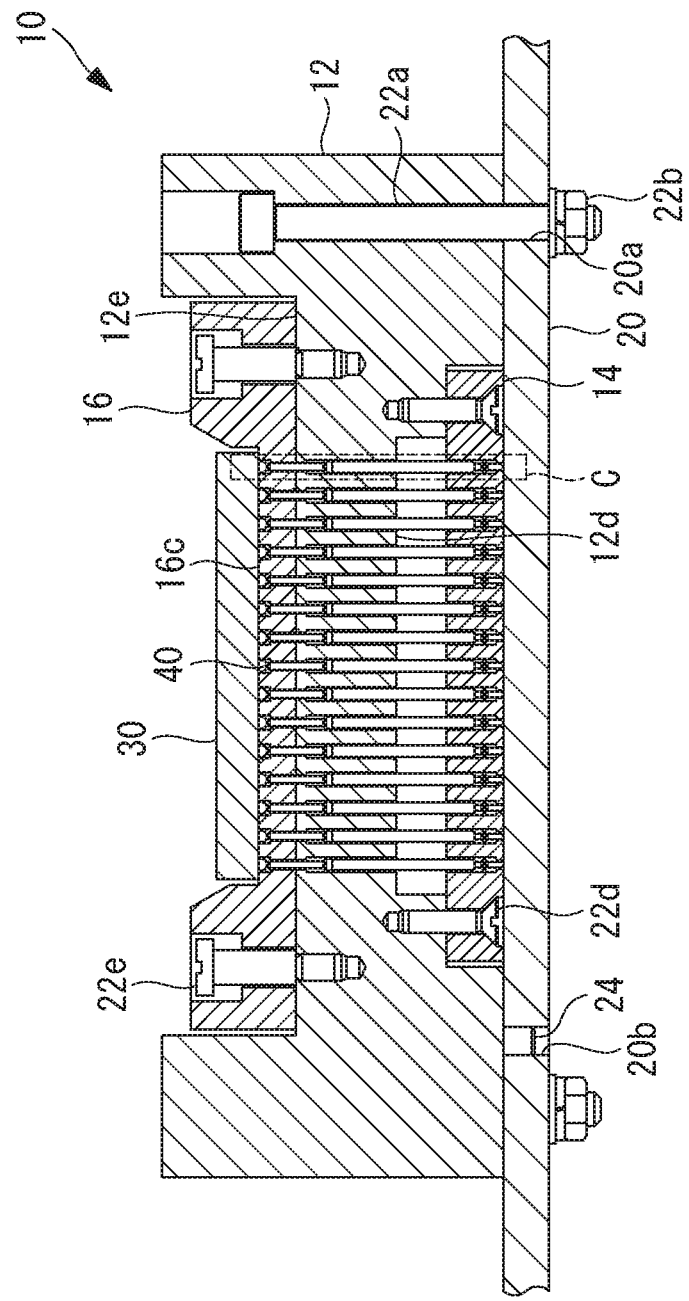
FIG. 3 is a longitudinal cross-sectional view showing the socket according to the embodiment of the present disclosure after the socket is mounted on the test board and after the IC package is mounted.

FIG. 1 to FIG. 3 show the inspecting socket 10 (hereinafter, referred to simply as "the socket 10").

FIG. 1 shows the socket 10 before mounted on a test board 20 such as a printed wiring board, FIG. 2 shows the socket 10 mounted on the test board 20, and FIG. 3 shows the socket 10 to which an IC package (an inspection device) 30 is further mounted.

The socket 10 is disposed and mounted on the test board 20. The socket 10 and the test board 20 are fixed to each other by inserting a board fixing bolt 22a of the socket 10 into a bolt hole 20a formed in the test board 20, and tightening a board fixing nut 22b from below.

A washer (e.g., a plain washer or a spring washer) may be provided between the board fixing nut 22b and the test board 20 so that the board fixing bolt 22a is inserted through the washer.

The socket 10 and the test board 20 are positioned to each other by inserting a board positioning pin 24 provided in the socket 10 into a positioning hole 20b formed in the test board 20.

The socket 10 houses a plurality of contact probes 40 each extending in an up-down direction in the drawing. The socket 10 comprises a socket body 12, a socket fixing part 14 attached to the socket body 12 from below, and a pedestal (a socket movable part) 16 attached to the socket body 12 from above.

The plurality of contact probes 40 are arranged at a predetermined pitch. For example, when an outer diameter of a barrel 50 (described later) of each of the contact probes 40 is 0.2 mm, the contact probes 40 are arranged at a pitch of 0.3 mm. Description will be made later in detail as to the contact probe 40.

In a lower part of the socket body 12, a stepped recess 12d of a lower surface opening is formed, and the socket fixing part 14 is fitted in the recess and abuts on a step portion of the recess. The socket body 12 and the socket fixing part 14 are fixed to each other via a fixing side screw 22d. At this time, a space is formed between a lower surface of the socket body 12 and an upper surface of the socket fixing part.

As shown in FIG. 1 to FIG. 3, a pedestal housing part 12e is formed as a recess of an upper surface opening in an upper part of the socket body 12, and the pedestal 16 is housed in the pedestal housing part 12e and attached to be movable close to and away from the socket body 12.

In an upper part of the pedestal 16, a mounting part 16c is formed as a recess of an upper surface opening, and the IC package 30 is disposed inside the mounting part 16c (see FIG. 3).

As shown in FIG. 2, when the IC package 30 is not mounted, the pedestal 16 is disposed away from the socket body 12 via a predetermined gap.

The pedestal 16 is urged in a direction away from the socket body 12 by an unshown urging member. Consequently, the gap between the pedestal 16 and the socket body 12 is maintained. Note that a distance between the pedestal 16 and the socket body 12 is regulated with a movable side screw 22e fixed to the socket body 12 so that the pedestal 16 does not fall from the pedestal housing part 12e due to the urging member.

As shown in FIG. 3, when the IC package 30 is mounted, the pedestal 16 is pushed in toward the socket body 12, and a lower surface of the pedestal 16 comes in surface contact with a bottom surface of the pedestal housing part 12e. In this state, the pedestal 16 and the socket body 12 are temporarily fixed with an unshown locking member.

Next, the contact probe 40 housed in the socket 10 will be described.

Figure 4:
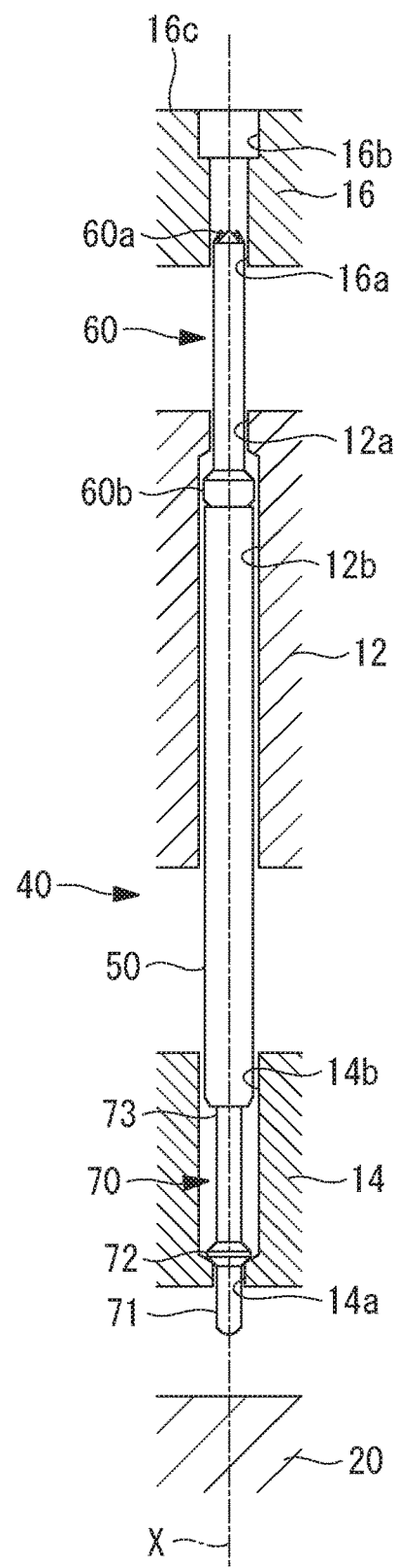
FIG. 4 is a partially enlarged view of part A shown in FIG. 1.
Figure 5:
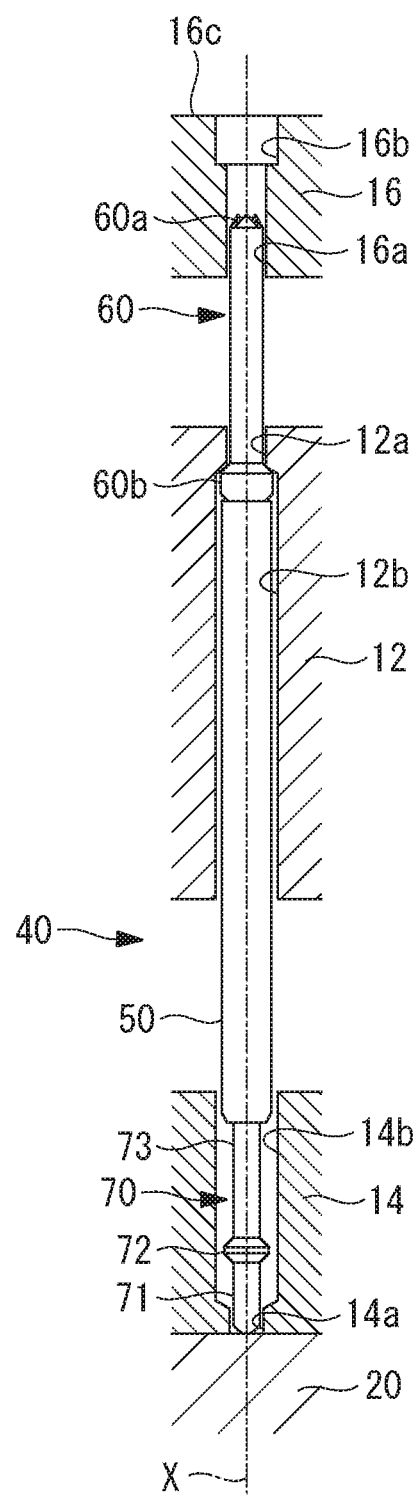
FIG. 5 is a partially enlarged view of part B shown in FIG. 2.
Figure 6:
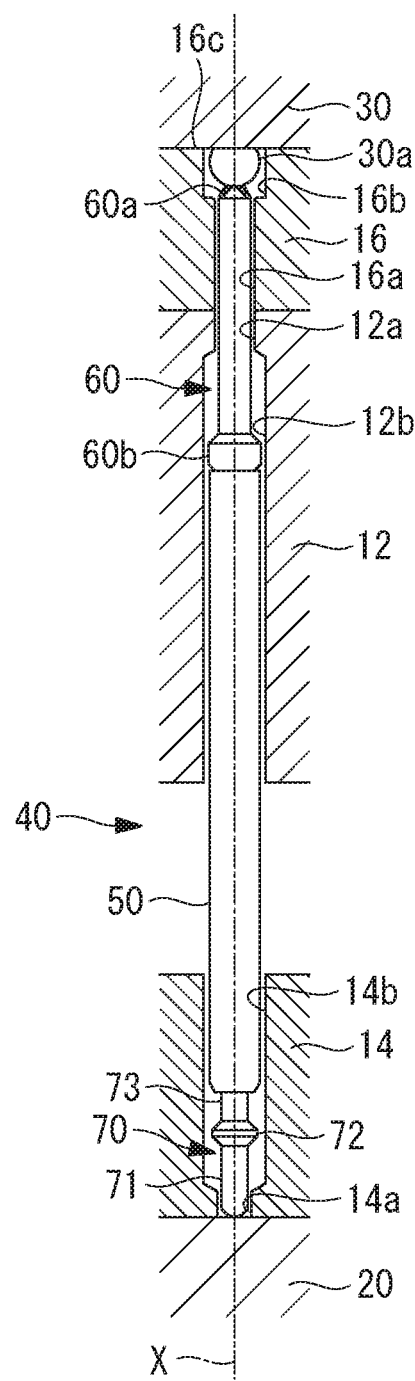
FIG. 6 is a partially enlarged view of part C shown in FIG. 3.

FIG. 4 to FIG. 6 show the contact probe 40 housed in the socket 10.

FIG. 4 corresponds to part A of FIG. 1, and shows the contact probe 40 in a state where the socket 10 is not mounted on the test board 20 and the IC package 30 is not mounted to the socket 10. FIG. 5 corresponds to part B of FIG. 2, and shows the contact probe 40 in a state where the socket 10 is mounted on the test board 20 and the IC package 30 is not mounted to the socket 10. FIG. 6 corresponds to part C of FIG. 3, and shows the contact probe 40 in a state where the socket 10 is mounted on the test board 20 and the IC package 30 is mounted to the socket 10.

The contact probe 40 is housed in the socket 10 including the socket body 12, the socket fixing part 14 and the pedestal 16.

In the socket body 12, an inspection device side barrel housing part 12b is formed. The inspection device side barrel housing part 12b is a longitudinal hole pierced upward from the lower surface of the socket body 12, and houses an upper side of the barrel 50 that the contact probe 40 has.

At an upper end of the inspection device side barrel housing part 12b, an inspection device side through hole 12a having a diameter smaller than a diameter of the inspection device side barrel housing part 12b is formed, and a tip end of a first plunger (an inspection device side terminal) 60 that the contact probe 40 has projects from the inspection device side through hole 12a.

In the socket fixing part 14, a test board side barrel housing part 14b is formed. The test board side barrel housing part 14b is a longitudinal hole pierced downward from the upper surface of the socket fixing part 14, and houses a lower side of the barrel 50 that the contact probe 40 has.

At a lower end of the test board side barrel housing part 14b, a test board side through hole 14a having a diameter smaller than a diameter of the test board side barrel housing part 14b is formed, and a tip end of a second plunger (a test board side terminal) 70 that the contact probe 40 has projects from the test board side through hole 14a.

As shown in FIG. 5 and FIG. 6, the tip end of the second plunger 70 that projects from the test board side through hole 14a comes in contact with the test board 20, so that the contact probe 40 is electrically connected to the test board 20. Note that the test board side through hole 14a may have such a straight shape as shown in the drawing, or may have a tapered shape.

As shown in FIG. 4 and FIG. 5, a pedestal through hole 16a is formed in the pedestal 16. The pedestal through hole 16a is a longitudinal hole pierced upward from the lower surface of the pedestal 16, and a tip end side of the first plunger (the inspection device side terminal) 60 that projects from the inspection device side through hole 12a is inserted into the pedestal through hole 16a.

Furthermore, as shown in FIG. 6, at an upper end of the pedestal through hole 16a, a solder ball housing part 16b having a diameter larger than a diameter of the pedestal through hole 16a is formed. The solder ball housing part 16b extends through a bottom surface of the mounting part 16c formed in the pedestal 16, and is configured to house a solder ball 30a of the IC package 30 mounted on the mounting part 16c.

In the solder ball housing part 16b, the tip end (a pointed portion 60a) of the first plunger 60 that projects from the pedestal through hole 16a through the inspection device side through hole 12a comes in contact with the solder ball 30a, so that the contact probe 40 is electrically connected to the IC package 30.

Next, details of the contact probe 40 will be described.

Figure 7:
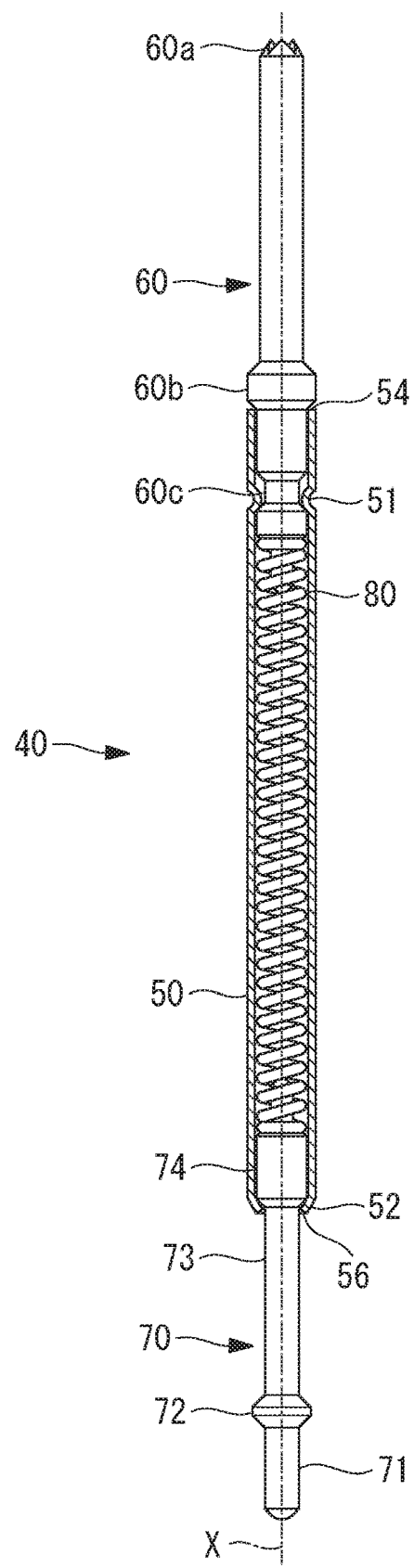
FIG. 7 is a view showing a contact probe according to an embodiment of the present disclosure.

FIG. 7 shows the contact probe 40. Note that this drawing shows a cross-sectional view of the barrel 50.

The contact probe 40 comprises the barrel 50 formed in a cylindrical shape having opposite ends opened and extending in an axial X-direction, the first plunger 60 disposed in an upper part (one end 54 side) of the barrel 50, the second plunger 70 disposed in a lower part (the other end 56 side) of the barrel 50, and a spring 80 housed in the barrel 50. That is, the contact probe 40 includes a four-component configuration comprising the barrel 50, the first plunger 60, the second plunger 70 and the spring 80.

The first plunger 60 is made of a metal, and examples of the metal for use include beryllium copper, phosphor bronze, a mother material such as SK material plated with nickel gold, and unplated palladium alloy.

The first plunger 60 is formed in a round bar shape having a central axis (an axis X) common to the cylindrical barrel 50.

In the tip end (an upper end in the drawing) of the first plunger 60, a plurality of so-called crown cut pointed portions 60a are formed, and the solder ball 30a of the IC package 30 is held among the respective pointed portions 60a (see FIG. 6).

On a base end side (a lower end side in the drawing) of the first plunger 60, a reduced portion 60c is formed. The reduced portion 60c has a diameter smaller than an inner diameter of the barrel 50.

An expanded portion 60b is formed between the reduced portion 60c and the pointed portion 60a. The expanded portion 60b has a diameter larger than the inner diameter of the barrel 50.

The base end side of the first plunger 60 that includes the reduced portion 60c is disposed in the barrel 50. Furthermore, an end (one end) 54 of the barrel 50 abuts on an underside of the expanded portion 60b formed in the first plunger 60. That is, the first plunger 60 on the base end side of the expanded portion 60b is disposed in the barrel 50. At this time, the barrel 50 is provided with a first caulked portion 51 formed so that a part of an inner circumferential surface of the caulked portion 51 enters the reduced portion 60c. According to this configuration, the first plunger 60 is fixed to the barrel 50.

The second plunger 70 is made of a metal, and examples of the metal for use include beryllium copper, phosphor bronze, a mother material such as SK material plated with nickel gold, and unplated palladium alloy.

The second plunger 70 is formed in a round bar shape having a central axis (the axis X) common to the cylindrical barrel 50.

The second plunger 70 includes a terminal body formed with a first shaft section 71, a second shaft section 72 having a diameter larger than a diameter of the first shaft section 71, and a third shaft section 73 having a diameter smaller than the diameter of the second shaft section 72 from a tip end (a lower end in the drawing) side located in the test board 20 toward a base end side (an upper end in the drawing). Furthermore, on a base end side of the third shaft section 73, a stop portion 74 is provided. That is, the second plunger 70 in the present embodiment includes the terminal body and the stop portion 74. At this time, the terminal body (the first shaft section 71, the second shaft section 72 and the third shaft section 73) can project from the end 56 of the barrel 50, and the stop portion 74 is held in the barrel 50.

Note that the first shaft section 71 and the third shaft section 73 may have the same diameter or different diameters.

As shown in FIG. 4 to FIG. 6, the first shaft section 71 is formed as a portion that projects from the test board side through hole 14a formed in the socket fixing part 14 and comes in contact with the test board 20.

As shown in FIG. 4, the second shaft section 72 has the diameter larger than the diameter of the test board side through hole 14a. Consequently, the second shaft section 72 is caught in the test board side through hole 14a, and hence drop of the second plunger 70 from the test board side through hole 14a can be avoided. Furthermore, a position of the second shaft section 72 in the axial X-direction is adjusted, so that a projection amount of the first shaft section 71 from the test board side through hole 14a can be controlled. Additionally, an insertion amount of the tip end side of the first plunger 60 in the pedestal through hole 16a of the pedestal 16 can be controlled.

As to outer diameters of the first shaft section 71 and the second shaft section described above, for example, when the outer diameter of the barrel 50 is 0.2 mm, the outer diameter of the first shaft section 71 is 0.105 mm, and the outer diameter of the second shaft section 72 is 0.18 mm. Note that these dimensions are illustrative, and can be arbitrarily changed in accordance with specifications of the contact probe 40 and the like.

As shown in FIG. 7, the stop portion 74 has a diameter larger than the diameter of the third shaft section 73 and is disposed in the barrel 50. At this time, the barrel 50 is provided with a second caulked portion 52 formed so that an inner diameter of the end (the other end) 56 of the barrel 50 is reduced over an entire circumferential direction toward the third shaft section 73. Consequently, a downside of the stop portion 74 of the second plunger 70 abuts on an upside of the second caulked portion 52 of the barrel 50. That is, the stop portion 74 abuts on the second caulked portion 52 in a direction from the end 54 of the barrel 50 toward the end 56 thereof, thereby avoiding drop of the second plunger 70 from the barrel 50.

The spring 80 is housed in the barrel 50, and is in contact in a state where the base end side of the first plunger 60 and the base end side (the stop portion 74) of the second plunger 70 are initially displaced (contracted). Consequently, the first plunger 60 and the second plunger 70 are urged in a direction away from each other.

Figure 8:
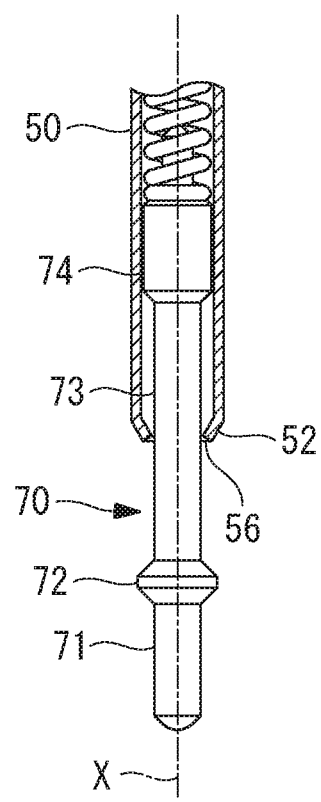
FIG. 8 is a view showing a part of the contact probe in a state where a part of a third shaft section is housed in a barrel.

At this time, the first plunger 60 is fixed to the barrel 50. On the other hand, the second plunger 70 has the stop portion 74 that only abuts on the second caulked portion 52 of the barrel 50. Consequently, as shown in FIG. 8, the second plunger 70 of two plungers is only movable forward and backward along the axial X-direction of the barrel 50. At this time, the third shaft section 73 having the diameter smaller than an inner diameter of the second caulked portion 52 can be housed in the barrel 50, and the second shaft section 72 having the diameter larger than the inner diameter of the second caulked portion 52 is not housed in the barrel 50 and is located outside the barrel 50. Note that the third shaft section 73 is housed in the barrel 50 and projected therefrom as the second plunger 70 moves forward and backward. However, the third shaft section 73 does not have to be entirely housed in the barrel 50, and at least a part of the third shaft section 73 may only be housed in the barrel 50.

The second caulked portion 52 does not necessarily have to be provided in the end 56 of the barrel 50. For example, in a modification shown in FIG. 9, the second caulked portion 52 may be provided between the end 54 and the end 56 of the barrel 50 (see FIG. 7).

In this case, an intermediate shaft section 75 having a diameter smaller than each of the diameters of the third shaft section 73 and the stop portion 74 is provided between the third shaft section 73 and the stop portion 74, and is configured so that the second caulked portion 52 enters a region of the intermediate shaft section 75 along the axial X-direction. Furthermore, an outer diameter of the third shaft section 73 corresponds to the inner diameter of the barrel 50 so that the third shaft section 73 slides in the barrel 50 below the second caulked portion 52. Additionally, it is preferable that a plurality of second caulked portions 52 are provided in a circumferential direction by point caulking.

The socket 10 comprising the contact probe 40 described above is used as follows.

First, as shown in FIG. 1 and FIG. 4, a plurality of contact probes 40 are arranged and housed in the socket 10 comprising the socket body 12, the socket fixing part 14 and the pedestal 16. At this time, the first shaft section 71 of the second plunger 70 projects from the test board side through hole 14a.

Next, as shown in FIG. 2 and FIG. 5, the socket 10 is disposed and mounted on the test board 20. At this time, a tip end of the first shaft section 71 of the second plunger 70 comes in contact with the test board 20, and accordingly, the contact probe 40 is lifted to a pedestal 16 side.

In the lifted contact probe 40, an upper part of the expanded portion 60b of the first plunger 60 abuts on a lower end of the inspection device side through hole 12a of the socket body 12. Consequently, an amount of the contact probe 40 to be lifted is regulated, and the third shaft section 73 of the second plunger 70 is pushed into the barrel 50, so that the contact probe 40 is preloaded.

Next, as shown in FIG. 3 and FIG. 6, the IC package 30 is mounted in the mounting part 16c of the pedestal 16, and the IC package 30 and the pedestal 16 are pushed into a socket body 12 side.

In a process of pushing the IC package 30 and the pedestal 16 inwardly, the solder ball 30a comes in contact with the pointed portion 60a of the first plunger 60 in the solder ball housing part 16b. The IC package 30 and the pedestal 16 are pushed into the socket body 12 side in a state where the solder ball 30a is in contact with the pointed portion 60a, so that the pedestal 16 comes in contact with the socket body 12. At this time, the first plunger 60 and the barrel 50 are pushed into a socket fixing part 14 side. Consequently, the third shaft section 73 of the second plunger 70 further enters the barrel 50.

Thus, the third shaft section 73 enters the barrel 50 to compress the spring 80 in the barrel 50. Consequently, the contact probe 40 is in contact with the test board 20 and the IC package 30 with an appropriate repulsive force, and hence an excellent contact state can be maintained. Then, the contact probe 40 is electrically connected to the IC package 30, and the IC package 30 is electrically connected to the test board 20 via the contact probe 40.

Note that it is necessary to ensure that a stroke amount of the second plunger 70 (a limit amount with which the third shaft section 73 can be pushed into the barrel 50) is larger than a push-in amount of the pedestal 16.

According to the present embodiment, following effects are produced.

According to the contact probe 40, the second shaft section 72 having the diameter larger than the diameter of the first shaft section 71 of the second plunger 70 abuts on the test board side through hole 14a from inside the test board side barrel housing part 14b of the socket fixing part 14. This can avoid drop of the contact probe 40 to a test board 20 side. Furthermore, the position of the second shaft section 72 along the axial X-direction is adjusted, so that the projection amount of the first shaft section 71 that projects from the test board side through hole 14a can be controlled. Additionally, a projection amount of the tip end side of the first plunger 60 that projects from the inspection device side through hole 12a can be controlled.

Figure 10:
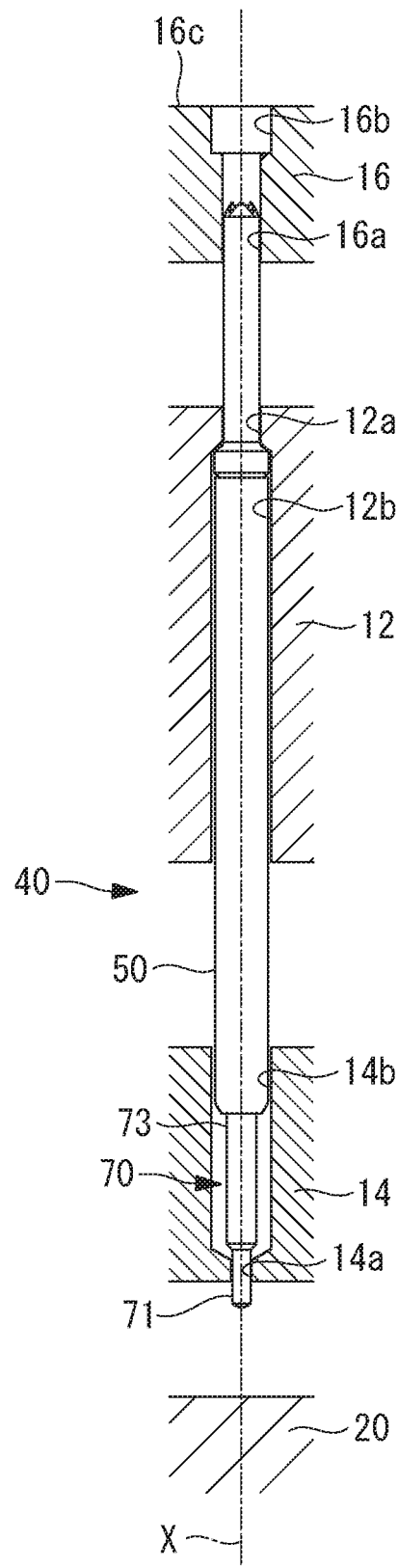
FIG. 10 is a view showing a contact probe according to a comparative example.
Figure 11:
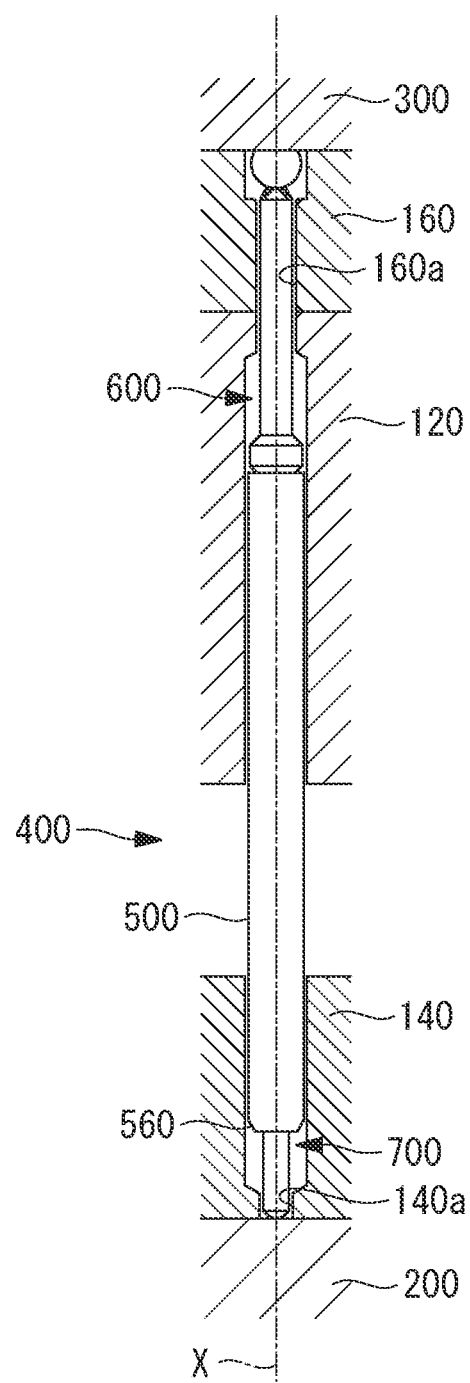
FIG. 11 is a view showing a contact probe according to a conventional example (when the probe is not mounted in the socket).
Figure 12:
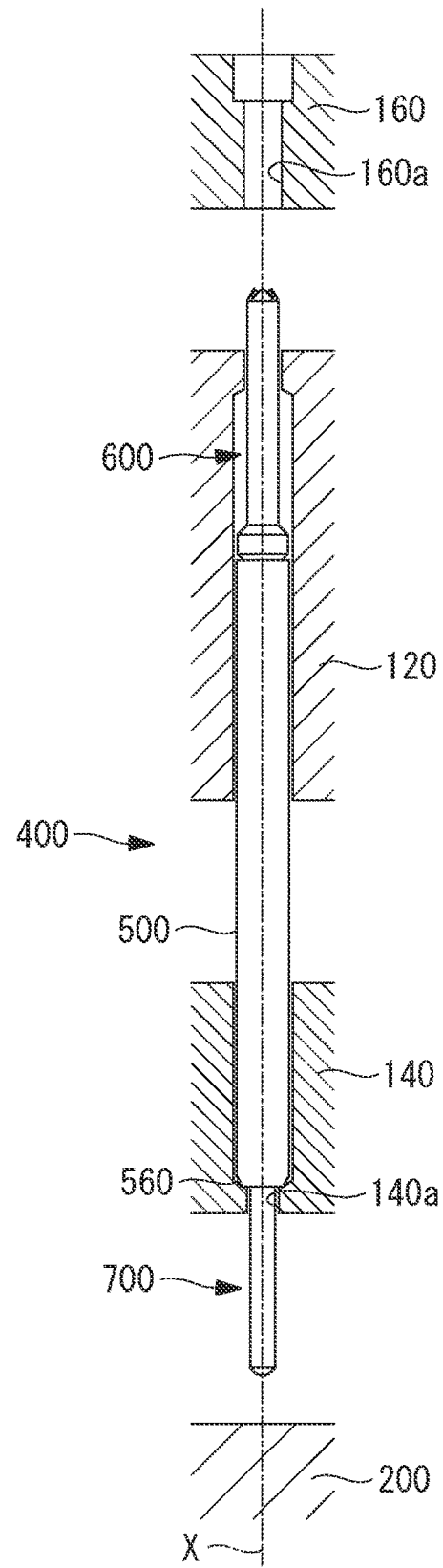
FIG. 12 is a view showing the contact probe according to the conventional example (when the IC package is not mounted).

Furthermore, as shown in FIG. 10 (a comparative example), if the third shaft section 73 itself is an abutment portion on the test board side through hole 14a without providing the second shaft section 72, the first shaft section 71 has to have the diameter smaller than that of the third shaft section 73. Then, decrease in strength or decrease in conductivity of the first shaft section 71 might be caused. On the other hand, as shown in FIG. 4, the second shaft section 72 having the diameter partially expanded is provided, and hence the first shaft section 71 does not have to have the diameter smaller than that of the third shaft section 73. This can acquire the strength of the first shaft section 71 and improve the conductivity. Furthermore, the acquiring of the strength can improve productivity (processing yield). This can be effective in miniaturization of the contact probe that is expected in future.

Note that in FIG. 10, for example, when the outer diameter of the barrel 50 is 0.22 mm, the outer diameter of the third shaft section 73 is 0.125 mm, and the outer diameter of the first shaft section 71 is 0.075 mm. On the other hand, in case of the present embodiment (see FIG. 4), as described above, the outer diameter of the first shaft section 71 is 0.105 mm. That is, the diameter is as much as about 0.03 mm larger than that in the comparative example shown in FIG. 10.

Figure 9:
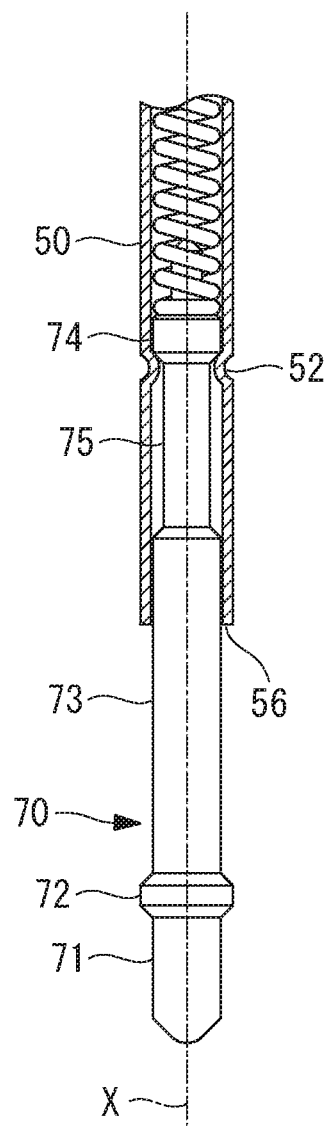
FIG. 9 is a view showing a modification of a second caulked portion.

Furthermore, in case where the second caulked portion 52 is formed at the end 56 of the barrel 50 as shown in FIG. 7, the second plunger 70 can be shortened as compared with case where the second caulked portion 52 is formed between the end 56 and the end 54 of the barrel 50 as shown in FIG. 9. This is because in the modification shown in FIG. 9, a distance from the second caulked portion 52 to the end 56 in the barrel 50 has to be acquired by the third shaft section 73 or the intermediate shaft section 75, but this is not necessary in case where the second caulked portion 52 is formed at the end 56 of the barrel 50. Thus, the second plunger 70 is shortened, so that reduction in material cost and improvement in productivity can be achieved.

REFERENCE SIGNS LIST 10 socket (an inspecting socket)
12 socket body
12a inspection device side through hole
12b inspection device side barrel housing part
12d stepped recess
12e pedestal housing part
14 socket fixing part
14a test board side through hole
14b test board side barrel housing part
16 pedestal (a socket movable part)
16a pedestal through hole
16b solder ball housing part
16c mounting part
20 test board
20a bolt hole
20b positioning hole
22a board fixing bolt
22b board fixing nut
22d fixing side screw
22e movable side screw
24 board positioning pin
30 IC package (an inspection device)
30a solder ball
40 contact probe
50 barrel
51 first caulked portion
52 second caulked portion
54 end (one end)
56 end (the other end)
60 first plunger (an inspection device side terminal)
60a pointed portion
60b expanded portion
60c reduced portion
70 second plunger (a test board side terminal)
71 first shaft section
72 second shaft section
73 third shaft section
74 stop portion
75 intermediate shaft section
80 spring The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. An inspection socket, comprising:
a contact probe that electrically connects a test board to an inspection device, the contact probe including:
- a barrel formed in a cylindrical shape having opposite ends opened, extending in an axial direction and including a caulked portion formed to reduce an inner diameter;
- an inspection device side terminal having a base end side fixed to a side of one end of the barrel and having a tip end in contact with the inspection device;
- a test board side terminal housed, on a side of the other end of the barrel, to be movable forward and backward and having a tip end in contact with the test board; and
- a spring disposed in the barrel in a state of being in contact with the test board side terminal and the inspection device side terminal, wherein the test board side terminal includes a stop portion that is to abut on the caulked portion in a direction from the one end side of the barrel toward the other end side in the barrel, and a terminal body that projects from the other end of the barrel, and
- the terminal body includes, in order from the tip end, a first shaft section that is arranged to come in contact with the test board, a second shaft section having a diameter larger than a diameter of the first shaft section, and a third shaft section having a diameter smaller than the diameter of the second shaft section and having at least a part to be housed in the barrel;

the inspection socket further including:
- a socket body housing the one end side of the barrel and including an inspection device side through hole from which the tip end side of the inspection device side terminal projects;
- a socket fixing part attached to the socket body, housing the other end side of the barrel and including a test board side through hole from which the first shaft section of the test board side terminal projects; and
- a socket movable part that is attached to be movable away from and close to the socket body in a state where the tip end side of the inspection device side terminal that projects from the socket body is inserted into a pedestal through hole, and on which the inspection device is mounted, wherein the test board side through hole has a diameter smaller than the diameter of the second shaft section.

2. An inspection socket, comprising:
a contact probe that electrically connects a test board to an inspection device, the contact probe including:
- a barrel formed in a cylindrical shape having opposite ends opened, extending in an axial direction and including a caulked portion formed to reduce an inner diameter;
- an inspection device side terminal having a base end side fixed to a side of one end of the barrel and having a tip end in contact with the inspection device;
- a test board side terminal housed, on a side of the other end of the barrel, to be movable forward and backward and having a tip end in contact with the test board; and
- a spring disposed in the barrel in a state of being in contact with the test board side terminal and the inspection device side terminal, wherein the test board side terminal includes a stop portion that is to abut on the caulked portion in a direction from the one end side of the barrel toward the other end side in the barrel, and a terminal body that projects from the other end of the barrel,
- the caulked portion is formed at the other end of the barrel, and
- the terminal body includes, in order from the tip end, a first shaft section that is arranged to come in contact with the test board, a second shaft section having a diameter larger than a diameter of the first shaft section, and a third shaft section having a diameter smaller than the diameter of the second shaft section and having at least a part to be housed in the barrel;

the inspection socket further including:
- a socket body housing the one end side of the barrel and including an inspection device side through hole from which the tip end side of the inspection device side terminal projects;
- a socket fixing part attached to the socket body, housing the other end side of the barrel and including a test board side through hole from which the first shaft section of the test board side terminal projects; and
- a socket movable part that is attached to be movable away from and close to the socket body in a state where the tip end side of the inspection device side terminal that projects from the socket body is inserted into a pedestal through hole, and on which the inspection device is mounted, wherein the test board side through hole has a diameter smaller than the diameter of the second shaft section.

* * * * *